(12) United States Patent
Yabuuchi

(10) Patent No.: US 10,925,157 B2
(45) Date of Patent: Feb. 16, 2021

(54) FLEXIBLE WIRING BOARD AND DISPLAY DEVICE

(71) Applicant: SHARP KABUSHIKI KAISHA, Sakai (JP)

(72) Inventor: Hideaki Yabuuchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 7 days.

(21) Appl. No.: 16/368,500

(22) Filed: Mar. 28, 2019

(65) Prior Publication Data

US 2019/0306967 A1 Oct. 3, 2019

Related U.S. Application Data

(60) Provisional application No. 62/649,728, filed on Mar. 29, 2018.

(51) Int. Cl.
*H05K 1/00* (2006.01)
*H05K 1/02* (2006.01)

(52) U.S. Cl.
CPC ... *H05K 1/028* (2013.01); *H05K 2201/10136* (2013.01)

(58) Field of Classification Search
CPC .............. H05K 1/028; H05K 2201/10136
See application file for complete search history.

(56) References Cited

U.S. PATENT DOCUMENTS

| 7,746,439 B2* | 6/2010 | Kohno ................ G02F 1/13452 349/150 |
| 9,560,761 B2* | 1/2017 | Kishida .................. H05K 1/028 |
| 9,723,712 B2* | 8/2017 | Cho ....................... H05K 1/028 |
| 9,992,872 B2* | 6/2018 | Nakase ................ G06F 3/0416 |
| 10,076,027 B2* | 9/2018 | Yamamoto ............. G09G 5/006 |
| 10,281,779 B2* | 5/2019 | Shibahara ......... G02F 1/133382 |
| 2008/0088768 A1 | 4/2008 | Kohno |
| 2019/0250441 A1* | 8/2019 | Hiramoto ............ G02F 1/13452 |

FOREIGN PATENT DOCUMENTS

JP 2008-096866 A 4/2008

* cited by examiner

*Primary Examiner* — Binh B Tran
(74) *Attorney, Agent, or Firm* — ScienBiziP, P.C.

(57) ABSTRACT

A flexible board is formed by mounting a one end of the flexible board on a mounting surface provided on a liquid crystal panel, the mounting surface having a curved shape, and by folding back the flexible board from the one end through another end. The flexible board includes a bent portion in which, at a position between the one end and the other end, a gap to the one end changes according to the position along a curving direction of the mounting surface, the bent portion being formed by bending at least a portion among the positions where the gap to the one end is small so as to make the portion protrude in a direction that crosses a board surface of the flexible board.

11 Claims, 15 Drawing Sheets

FLEXIBLE WIRING BOARD AND DISPLAY DEVICE

This application claims priority from U.S. Provisional Application No. 62/649,728 filed on Mar. 29, 2018. The entire contents of the priority application are incorporated herein by reference.

TECHNICAL FIELD

The present invention relates to a flexible wiring board and a display device.

BACKGROUND

Conventionally, as an example of a liquid crystal display device including a liquid crystal panel with a curved shape, one that is disclosed in Patent Document 1 below is known. A liquid crystal display device disclosed in Patent Document 1 includes a film mounted with a liquid crystal driving semiconductor chip. The film mounted with a liquid crystal driving semiconductor chip is provided with slits each having a small circular hole at a tip end of the film. The slit changes in width to allow the same chip on film (COF) mounted with liquid crystal driving semiconductor chip to be used in common even when a gap between a liquid crystal panel and a control circuit board is not uniform.
Patent Literature 1: Japanese Unexamined Patent Application Publication No. 2008-96866

In the liquid crystal display device disclosed in Patent Document 1 of the above, the film is formed with the slits in order to connect the liquid crystal panel and the control circuit board between which the gap has become not uniform due to the liquid crystal panel being curved, thereby alleviating stress that could be generated in the film. However, there has been a problem that by forming the slits in the film, damages such as cuts in the film are more likely to occur due to the slits.

SUMMARY

The present invention is achieved based on the above circumstance, and an object of the invention is to alleviate stress without forming slits in a film.

The flexible wiring board of the present invention is formed by mounting a one end of the flexible wiring board on a mounting surface provided on a curved component, the mounting surface having a curved shape, and by folding back the flexible wiring board from the one end through another end. The flexible wiring board includes a bent portion in which, at a position between the one end and the other end, a gap to the one end changes according to the position along a curving direction of the mounting surface, the bent portion being formed by bending at least a portion among the positions where the gap to the one end is small so as to make the portion protrude in a direction that crosses a board surface of the flexible wiring board.

With this configuration, the flexible wiring board is folded back from the one end through the other end, and the one end among the two ends is mounted on the mounting surface with the curved shape in the curved component. The mounting surface of the curved component is curved along the curving direction; therefore, the one end of the flexible wiring board mounted thereon is also curved by following the mounting surface. Accordingly, at a position between the one end and the other end, the flexible wiring board has the gap to the one end which changes according to the position along the curving direction, and at a portion where the gap is small, a redundant portion is created more as compared to a portion where the gap is large. Because the flexible wiring board is folded back from the one end through the other end, when the above redundant portion is created, there is a concern that local stress is generated.

In this regard, the flexible wiring board includes the bent portion in a position between the one end and the other end, and because this bent portion is formed by bending at least a portion where the gap to the one end is small so as to make the portion protrude in the direction that crosses the board surface of the flexible wiring board, the redundant portion created by change in the gap to the one end can be enclosed by the bent portion. Accordingly, stress which could be generated in the flexible wiring board can be alleviated, and thereby suppressing defects such as disconnection from occurring. Besides, as compared to the conventional one that tries to reduce stress by forming slits, the flexible wiring board is not easily damaged by cuts or the like due to the slits because it is unnecessary to form the slits.

According to the present invention, stress is alleviated without forming the slits in the film.

DETAILED DESCRIPTION

First Embodiment

A first embodiment of the present invention will be described with reference to FIGS. 1 to 7. In the present embodiment, a flexible board (flexible wiring board) 14 and a liquid crystal display device (display device) 10 are exemplified. Note that X-axis, Y-axis, and Z-axis are shown in a portion of each figure, and each axis direction is drawn to correspond to a direction shown in each figure. Also, an up-and-down direction is based on a direction in FIGS. 2, 3, 6 and 7, and an upper side of these figures is referred to as a front side, and a lower side of these figures is referred to as a rear side.

Figure 1:
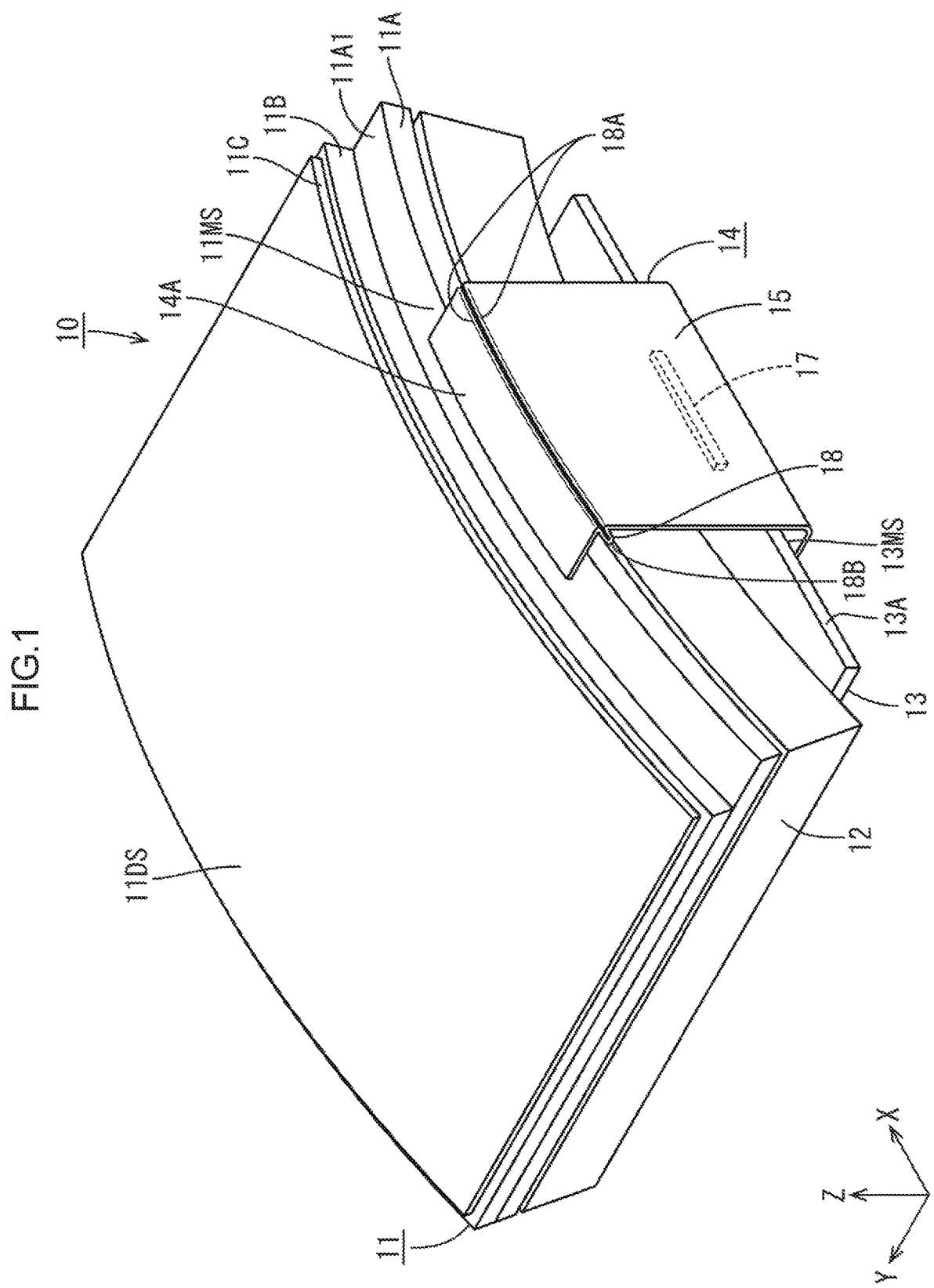
FIG. 1 is a perspective view of a liquid crystal display device according to a first embodiment of the present invention.

As shown in FIG. 1, the liquid crystal display device 10 at least includes a liquid crystal panel (curved component, curved display panel) 11 in which a display surface 11DS for displaying an image is curved, a backlight device (lighting device) 12 being an external light source that irradiates the liquid crystal panel 11 with light utilized in displaying, and a control circuit board (control board) 13 for supplying various input signals to the liquid crystal panel 11 from the outside. Among these components, the liquid crystal panel 11 and the control circuit board 13 are electrically connected with the flexible board 14.

As shown in FIG. 1, the liquid crystal panel 11 has a transversely long square shape (longitudinal shape) as a whole, and a long-side direction coincides with the X-axis direction in each figure, a short-side direction with the Y-axis direction in each figure, and a board thickness direction with the Z-axis direction of each figure. The liquid crystal panel 11 is curved in a substantially circular arc shape in which a center portion in the long-side direction (X-axis direction) is projected toward the front side, and both end portions in the long-side direction are recessed toward the rear side (outwardly-warped shape or camber shape). In other words, the liquid crystal panel 11 is curved around an unillustrated curving axis arranged along the short-side direction (Y-axis direction) on the rear side with respect to the liquid crystal panel 11. Accordingly, a curving direction (a direction along which a curvature of the display surface 11DS and a mounting surface 11MS changes) in the liquid crystal panel 11 coincides with the long-side direction (X-axis direction).

Figure 2:
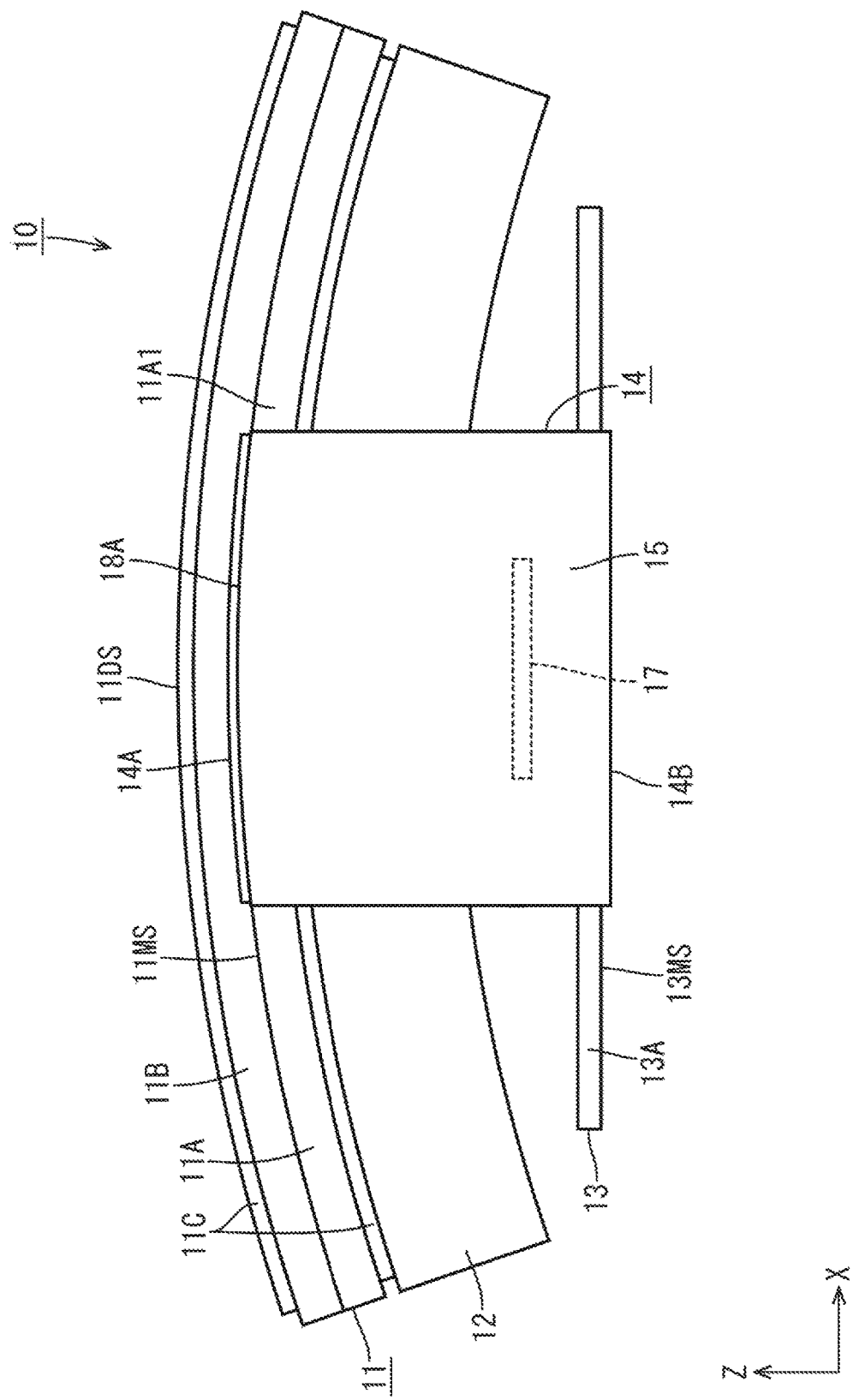
FIG. 2 is a front view of the liquid crystal display device.
Figure 3:
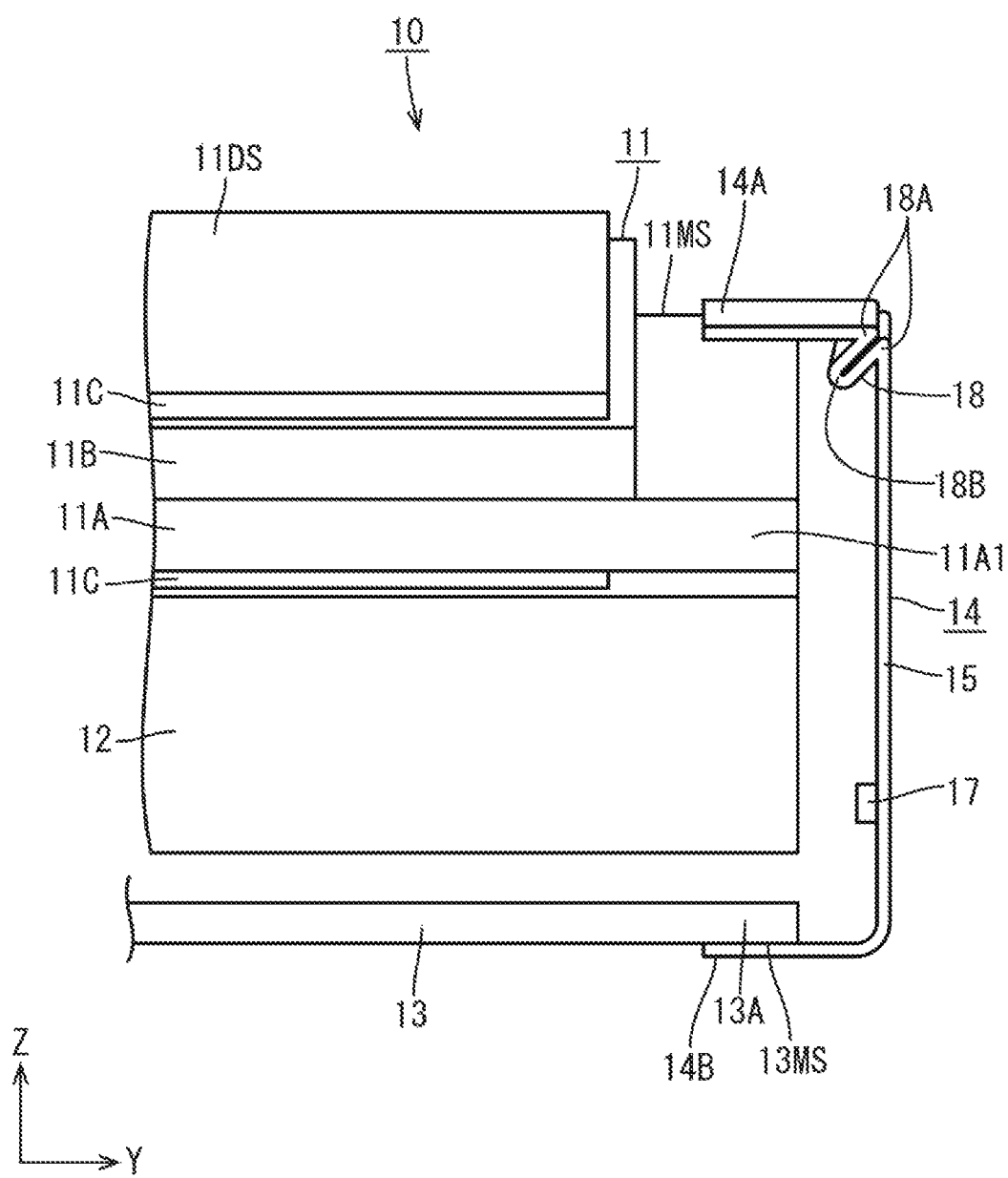
FIG. 3 is a side view of the liquid crystal display device.

As shown in FIGS. 2 and 3, the liquid crystal panel 11 has a configuration in which a pair of substantially transparent glass-made substrates 11A, 11B is pasted together while keeping a predetermined gap therebetween and liquid crystal is enclosed between the two substrates 11A, 11B. Among the pair of substrates 11A, 11B, the array substrate 11A arranged on the rear side is provided with switching elements (such as thin film transistors or TFTs) each connected to a source line and a gate line arranged orthogonal to each other, pixel electrodes each connected to each of the switching elements, and further with an alignment film and the like. Further, the color filter (CF) substrate 11B arranged on the front side is provided with a color filter on which colored portions such as R (red), G (green), B (blue) are arranged in a predetermined array, and further with an alignment film and the like. The array substrate 11A is formed larger in a short-side dimension than the CF substrate 11B, but meanwhile, the CF substrate 11B is pasted to the array substrate 11A while aligning one end portion in the short-side direction of the CF substrate 11B to one end portion in the short-side direction of the array substrate 11A. Accordingly, the other end portion in the short-side direction of the array substrate 11A is projected further out than the other end portion of the CF substrate 11B, and on this projected portion (mounting portion) 11A1, a one end 14A of the flexible board 14 is mounted. Therefore, a surface on the front side at the projected portion 11A1 of the array substrate 11A is formed as a mounting surface 11MS on which the one end 14A of the flexible board 14 is mounted, and on this mounting surface 11MS, a terminal portion (not illustrated) is provided to be connected to the one end 14A of the flexible board 14.

Additionally, a pair of front and rear polarizing plates 11C is pasted on outer surface sides of the pair of substrates 11A, 11B, respectively.

As shown in FIG. 1, the backlight device 12 has a transversely long square shape as a whole, and further, is arranged so as to overlap on the rear side of the liquid crystal panel 11 (the opposite side to a side of the display surface 11DS) and has a shape that follows a shape of the liquid crystal panel 11. The backlight device 12 at least includes an unillustrated light source (such as light emitting diode (LED) and organic electroluminescence (EL)) and an unillustrated optical member. The optical member has a function to convert light emitted from the light source to a planar shape.

As shown in FIG. 1, the control circuit board 13 is mounted on the rear surface of the backlight device 12 (an outer surface on the opposite side to a side of the liquid crystal panel 11), and is arranged in an overlapping manner in plan view to the liquid crystal panel 11 and the backlight device 12. The control circuit board 13 is formed into a flat shape. The control circuit board 13 is formed by mounting electronic components for supplying various input signals to the flexible board 14 on a substrate made of paper phenol or glass epoxy resin and routing unillustrated wiring (conductive paths) of a predetermined pattern. At an end portion (second mounting portion) 13A of the control circuit board 13, a surface is formed on the rear side as a mounting surface (second mounting surface) 13MS on which another end 14B of the flexible board 14 is mounted, and this mounting surface 13MS is provided with a terminal portion (not illustrated) connected to the other end 14B of the flexible board 14 by having the wiring partially exposed.

Figure 4:
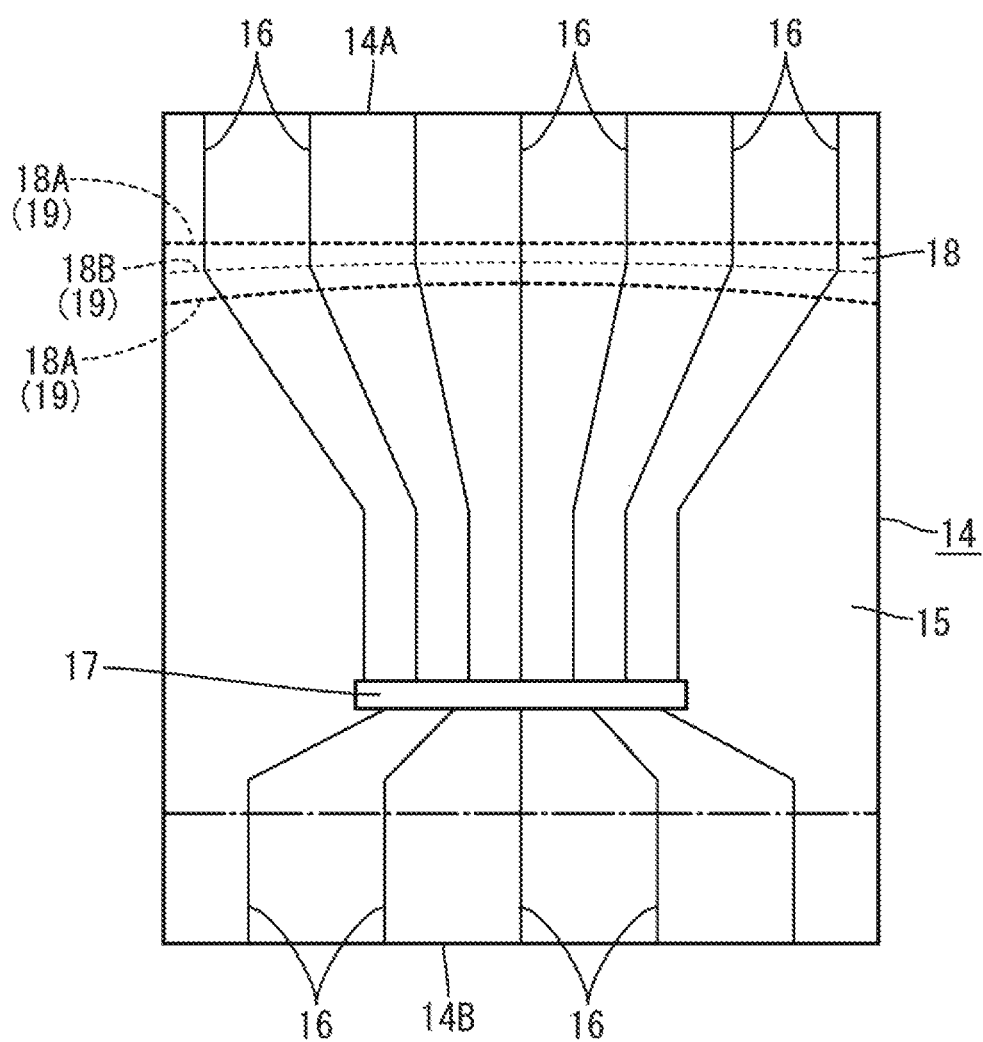
FIG. 4 is a plan view of a flexible board in a developed state.

As shown in FIG. 1, the flexible board 14 includes a base member 15 having a film shape and is formed of synthetic resin material having insulation property and flexibility (such as polyimide-based resin), and on the base member 15, wiring 16 including multiple wires (refer to FIG. 4) is patterned. The base member 15 has a band shape that extends along a direction from the side of the liquid crystal panel 11 (the side of the one end 14A) toward the side of the control circuit board 13 (the side of the other end 14B), and a length direction coincides with the Y-axis direction or Z-axis direction and a width direction coincides with the X-axis direction. The wiring 16 arranged on the base member 15 is mostly covered by an unillustrated insulation film (solder resist) in the present embodiment; however, both of the ends 14A, 14B are exposed to the outside by partially not forming the insulation film, and these exposed portions constitute the terminal portions (not illustrated) to be connected to the liquid crystal panel 11 and the control circuit board 13, respectively. Each of the terminal portions on the side of the flexible board 14 is electrically and mechanically connected to each of the terminal portions on the sides of the liquid crystal panel 11 and the control circuit board 13 via an unillustrated anisotropic conductive film (ACF). In the vicinity of a center portion in the length direction of the base member 15, a driver 17 is COF-mounted. The driver 17 is the one that is formed of a large-scale integration (LSI) chip inside of which is provided with a drive circuit, and that processes an input signal supplied from the control circuit board 13 being a signal supply source, generates an output signal, and outputs the output signal to the liquid crystal panel 11. The driver 17 is mounted on a surface of the base member 15 on which the wiring 16 is formed. As shown in FIG. 4, most or all wires of the wiring 16 pass through the driver 17 in a course of extending from the one end 14A to the other end 14B, and in each of the cases where the wires extend from the driver 17 to a side of the one end 14A and where the wires extend from the driver 17 to a side of the other end 14B, the wires are routed in a substantially fan shape.

As shown in FIG. 1, the flexible board 14 is connected at the one end 14A to the liquid crystal panel 11, but on the other hand, is connected at the other end 14B to the control circuit board 13 arranged overlappingly on the rear side to the liquid crystal panel 11. Accordingly, the flexible board 14 is folded from the one end 14A through the other end 14B. Also, the mounting surface 11MS of the liquid crystal panel 11 is curved along the X-axis direction (curving direction); therefore, the one end 14A of the flexible board 14 mounted thereon is also curved by following the mounting surface 11MS. The one end 14A of the flexible board 14 is curved at a substantially equal curvature with that of the mounting surface 11MS, and a center portion of which along the X-axis direction is arranged on the front side relative to the Z-axis direction (opposite to the side of the control circuit board 13), and both end portions of which along the X-axis direction is arranged on the rear side relative to the Z-axis direction (on the side of the control circuit board 13). Accordingly, as shown in FIG. 2, at a position between the one end 14A and the other end 14B, the flexible board 14 has a gap to the one end 14A which changes according to the position along the X-axis direction (curving direction). Specifically, the above gap is the smallest at both end positions and the largest at a center position along the X-axis direction of the flexible board 14. Accordingly, the both end portions at which the gap is small create a larger amount of redundant portion than the center portion at which the gap is large. Because the flexible board 14 is folded back from the one end 14A through the other end 14B, when the above redundant portion is created, there is a concern that local stress is generated.

To overcome this problem, as shown in FIG. 3, the flexible board 14 according to the present embodiment includes, at a position between the one end 14A and the other end 14B, a bent portion 18 formed by bending the flexible board 14 so as to protrude in a direction that crosses a board surface of the flexible board 14. The bent portion 18 is provided at an intermediate portion that extends substantially along the Z-axis direction within the flexible board 14 forming a folded-back shape from the one end 14A through the other end 14B. The bent portion 18 is formed by causing a portion of the above intermediate portion to protrude substantially along the Y-axis direction so as to cross with the board surface of the flexible board 14. Also, the bent portion 18 is provided, among the above intermediate portion, at least at the both end portions along the X-axis direction (curving direction), that is, at portions where the gap to the one end 14A becomes small. By this configuration, in the above intermediate portion in the flexible board 14, the redundant portion created by change in the gap to the one end 14A can be enclosed by the bent portion 18. Accordingly, stress which could be generated in the flexible board 14 can be alleviated, and thereby occurrence of defects such as disconnection can be suppressed.

Specifically, as shown in FIGS. 2 and 3, the bent portion 18 is arranged along the longitudinal direction of the flexible board 14 at a position between the one end 14A and the driver 17, and is also provided over the entire width (entire length) of the flexible board 14 along the X-axis direction at the position. With this configuration, as compared to the case of the bent portion being assumed to be provided only partially (selectively) at the both end portions along the X-axis direction in the flexible board 14, the bent portion 18 can be formed easier by only making a continuous fold over the entire width. As shown in FIG. 3, the bent portion 18 is protruded toward a side that approaches the liquid crystal panel 11 and the backlight device 12 from the intermediate portion of the flexible board 14, that is, inward. The bent portion 18 that protrudes from the intermediate portion of the flexible board 14 is arranged to be folded between other portions. With this configuration, as compared to the case of the bent portion being assumed to be protruded outward from the intermediate portion of the flexible board 14, the bent portion 18 is well fitted and does not easily interfere with components arranged on the outside. The bent portion 18 is approximately V-shaped in cross-section, has a pair of protrusion base end portions 18A and a protrusion tip end portion 18B, and is bent at the pair of protrusion base end portions 18A and the protrusion tip end portion 18B. Further, as shown in FIG. 4, bend facilitating portions 19 are provided at the pair of protrusion base end portions 18A and the protrusion tip end portion 18B being bent positions in the bent portion 18. The bend facilitating portions 19 are formed of perforations or the like for partially denting the base member 15 of the flexible board 14. The bend facilitating portions 19 arranged in the pair of protrusion base end portions 18A are formed on an outer board surface of the base member 15, and the bend facilitating portion 19 arranged in the protrusion tip end portion 18B is formed on an inside board surface of the base member 15. Note that in FIG. 4, the bend facilitating portions 19 arranged in the pair of protrusion base end portions 18A are shown in bold broken lines, and the bend facilitating portion 19 arranged in the protrusion tip end portion 18B is shown in a thin broken line. By providing the bend facilitating portions 19 in the bent portion 18 as described above, the bent portion 18 can be easily formed.

The bent portion 18 is configured such that, as shown in FIGS. 1 and 2, the protrusion base end portion 18A on a side of the one end 14A has a curved shape running in parallel with the mounting surface 11MS as in the one end 14A, and meanwhile, the protrusion base end portion 18A on a side of the driver 17 (side of the other end 14B) also has a curved shape running in parallel with the protrusion base end portion 18A on the side of the one end 14A. Then, the bent portion 18 is configured such that the protrusion tip end portion 18B also has a curved shape and is bent with a curvature smaller than that of the pair of protrusion base end portions 18A. With this configuration, the redundant portion, which is created by the one end 14A of the flexible board 14 being curved by following the mounting surface 11MS, can be appropriately enclosed further by the bent portion 18 in which the protrusion base end portions 18A and the protrusion tip end portion 18B are curved together along the curving direction.

In order to facilitate forming of the bent portion 18 having the above configuration, first, the bend facilitating portion 19 arranged in the protrusion base end portion 18A on the side of the one end 14A has a linear shape running along the X-axis direction in parallel with the one end 14A, as shown in FIG. 4. The bend facilitating portion 19 arranged in the protrusion base end portion 18A on the side of the driver 17 has a circular arc shape in plan view, a curve of which gradually approaches the protrusion base end portion 18A on the side of the one end 14A from the both end positions toward the center position along the X-axis direction. The bend facilitating portion 19 arranged in the protrusion tip end portion 18B has a circular arc shape similar to that of the bend facilitating portion 19 arranged in the protrusion base end portion 18A on the side of the driver 17; however, a curvature of which is set relatively small. More specifically, the bend facilitating portion 19 arranged in the protrusion tip end portion 18B is located at an approximately intermediate position between the bend facilitating portion 19 arranged in the protrusion base end portion 18A on the side of the one end 14A and the bend facilitating portion 19 arranged in the protrusion base end portion 18A on the side of the driver 17. A distance from each of the bend facilitating portions 19 arranged in each of the protrusion base end portions 18A to the bend facilitating portion 19 arranged in the protrusion tip end portion 18B is the largest at the both end positions along the X-axis direction and the smallest at the center position along the X-axis direction. Accordingly, the bent portion 18 bent and formed based on the above bend facilitating portions 19 has a protrusion margin from each of the protrusion base end portions 18A to the protrusion tip end portion 18B which is the largest at the both end positions along the X-axis direction and the smallest at the center position along the X-axis direction. In other words, it can be said that the bent portion 18 is curved such that the protrusion margin becomes larger as the gap to the one end 14A becomes smaller. Therefore, the redundant portion created by change in the gap to the one end 14A at the intermediate portion of the flexible board 14 can be more appropriately enclosed. Accordingly, stress which could be generated in the flexible board 14 can be suitably alleviated. Moreover, the bent portion 18 is bent such that the curvature of the protrusion tip end portion 18B becomes smaller than that of the protrusion base end portions 18A; therefore, it is suitable for equalizing between the protrusion base end portions 18A and the protrusion tip end portion 18B. Further, the bent portion 18 has the configuration in which the curvature of the pair of protrusion base end portions 18A is set equal to that of the mounting surface 11MS; therefore, the redundant portion, which is created by the one end 14A of the flexible board 14 being curved by following the mounting surface 11MS, can be mostly enclosed by the bent portion 18. Accordingly, stress due to the redundant portion is hardly created at the portion on the side of the other end 14B among the flexible board 14 with respect to the bent portion 18; therefore, stress that could be generated in the flexible board 14 can be more suitably alleviated.

Figure 5:
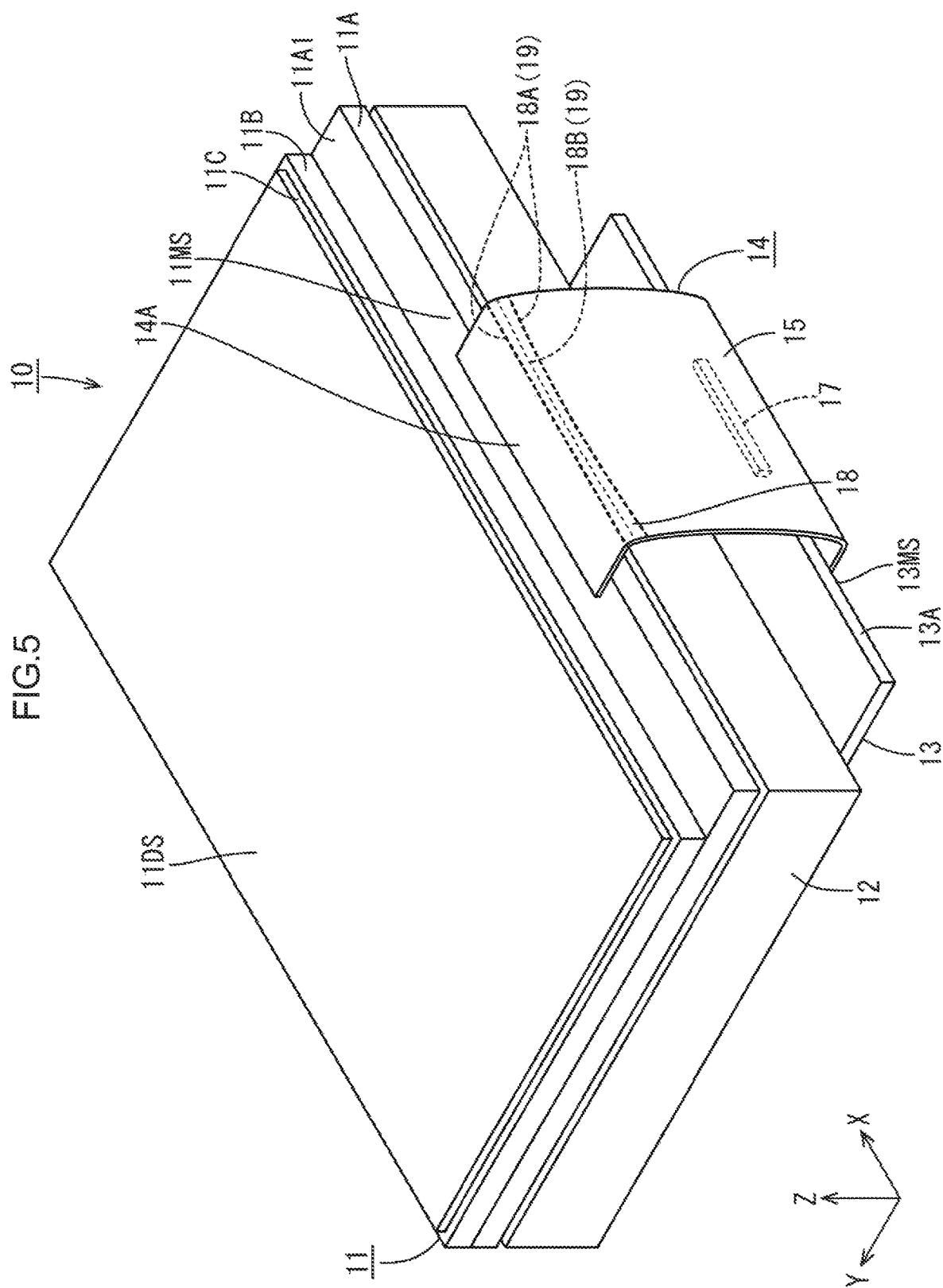
FIG. 5 is a perspective view showing a state before making the liquid crystal display device be curved.
Figure 6:
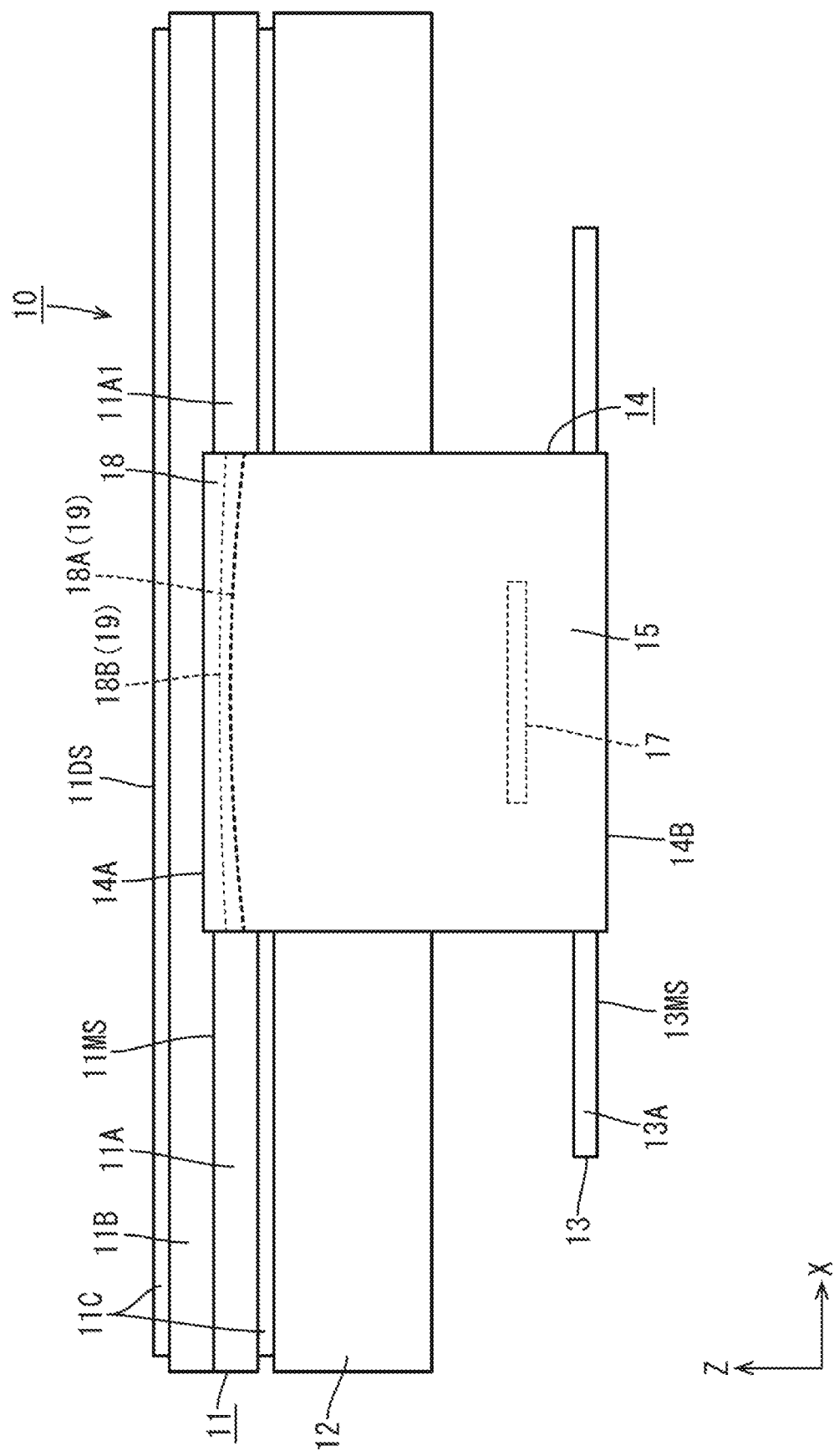
FIG. 6 is a front view showing the state before making the liquid crystal display device be curved.
Figure 7:
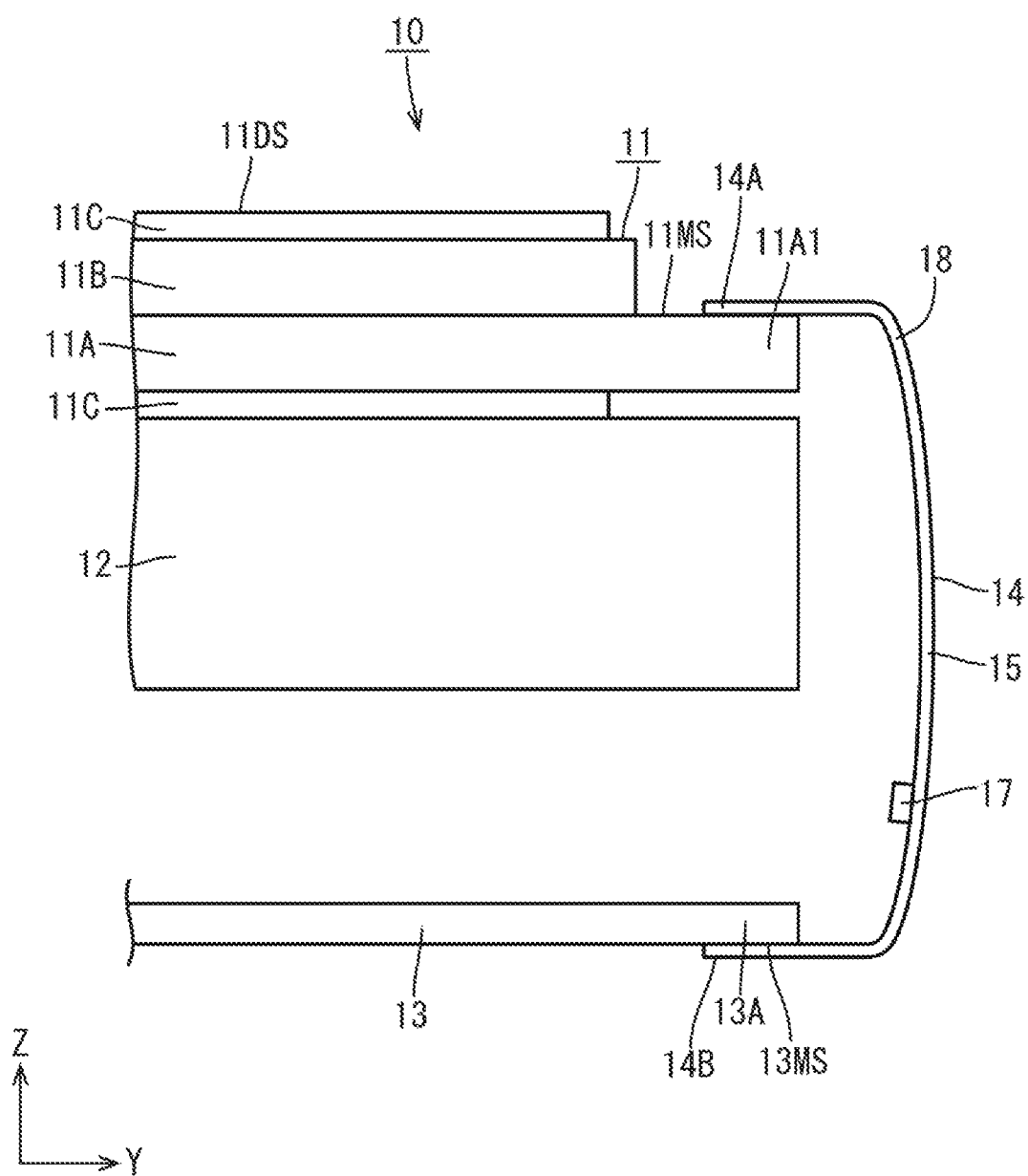
FIG. 7 is a side view showing the state before making the liquid crystal display device be curved.

The present embodiment has the above configuration, and a manufacturing procedure will described as follows. The liquid crystal panel 11 and the backlight device 12 are separately manufactured and then are assembled together to be integrated, and as shown in FIGS. 5 to 7, initially have outer surfaces (including the display surface 11DS and the mounting surface 11MS) in a flat state. The control circuit board 13 is attached to the rear side of the backlight device 12 in this state, and also, the one end 14A of the flexible board 14 is mounted on the mounting surface 11MS in the projected portion 11A1 of the liquid crystal panel 11, and the other end 14B of the flexible board 14 is mounted on the mounting surface 13MS at an end portion 13A of the control circuit board 13. In this state, the one end 14A and the other end 14B of the flexible board 14 both have a flat shape, and the bent portion 18 is not formed. Note that the bend facilitating portions 19 are provided in advance in the flexible board 14, accordingly, there may be a case in which force acting on the flexible board 14 causes the bend facilitating portions 19 to bend.

Thereafter, by performing curving processing on the liquid crystal panel 11 and the backlight device 12 in the flat state, the liquid crystal panel 11 and the backlight device 12 are bent as shown in FIGS. 1 to 3. As a result, the flexible board 14 is curved by the one end 14A following the mounting surface 11MS, and accordingly, the redundant portion is created at the intermediate portion of the flexible board 14. This redundant portion tends to become wider as approaching the both end sides along the X-axis direction and become narrower as approaching the center side along the X-axis direction. On the other hand, as the one end 14A of the flexible board 14 is curved, each of the bend facilitating portions 19 is bent spontaneously by force acting on the intermediate portion, forming the bent portion 18. Specifically, the pair of protrusion base end portions 18A is bent in a mountain-fold shape when viewed from outside, and meanwhile, the protrusion tip end portion 18B is bent in a valley-fold shape when viewed from outside. Also, in the bent portion 18, since the protrusion margin from the intermediate portion increases as approaching toward the both end sides along the X-axis direction and decreases as approaching the center side along the X-axis direction, the redundant portion created at the intermediate portion of the flexible board 14 can be appropriately enclosed. Moreover, the curvature of the pair of protrusion base end portions 18A in the bent portion 18 is set equal to that of the mounting surface 11MS, and the curvature of the protrusion tip end portion 18B is set smaller than that of the protrusion base end portions 18A; therefore, most of the redundant portion created at the intermediate portion of the flexible board 14 can be enclosed. Accordingly, the intermediate portion of the flexible board 14 does not easily cause stress and strain, and therefore, defects such as disconnection is not likely to occur in the wiring 16.

As described above, the flexible board (flexible wiring board) 14 of the present embodiment is formed by mounting the one end 14A on the mounting surface 11MS provided on the liquid crystal panel (curved component) 11, the mounting surface 11MS having a curved shape, and by folding back the flexible board (flexible wiring board) 14 from the one end 14A through the other end 14B. The flexible board (flexible wiring board) 14 includes the bent portion 18 in which, at a position between the one end 14A and the other end 14B, the gap to the one end 14A changes according to the position along the curving direction of the mounting surface 11MS, the bent portion 18 being formed by bending at least a portion among the positions where the gap to the one end 14A is small so as to make the portion protrude in a direction that crosses the board surface of the flexible board 14.

With this configuration, the flexible board 14 is folded back from the one end 14A through the other end 14B, and the one end 14A among the two ends is mounted on the mounting surface 11MS with the curved shape in the liquid crystal panel 11. The mounting surface 11MS of the liquid crystal panel 11 is curved along the curving direction; therefore, the one end 14A of the flexible board 14 mounted thereon is also curved by following the mounting surface 11MS. Accordingly, at a position between the one end 14A and the other end 14B, the flexible board 14 has the gap to the one end 14A which changes according to the position along the curving direction, and at a portion where the gap is small, a redundant portion is created more as compared to a portion where the gap is large. Because the flexible board 14 is folded back from the one end 14A through the other end 14B, when the above redundant portion is created, there is a concern that local stress is generated.

In this regard, the flexible board 14 includes the bent portion 18 at a position between the one end 14A and the other end 14B, and because this bent portion 18 is formed by bending at least a portion where the gap to the one end 14A is small so as to make the portion protrude in the direction that crosses the board surface of the flexible board 14, the redundant portion created by change in the gap to the one end 14A can be enclosed by the bent portion 18. Accordingly, stress which could be generated in the flexible board 14 can be alleviated, and thereby occurrence of defects such as disconnection can be suppressed. Besides, as compared to the conventional art that tries to reduce stress by forming slits, the flexible board 14 is not easily damaged by cuts or the like due to the slits because it is unnecessary to form the slits.

Further, the bent portion 18 is curved such that the protrusion margin becomes larger as the gap to the one end 14A becomes smaller. In the flexible board 14, at the position between the one end 14A and the other end 14B, the redundant portion tends to become larger as the gap to the one end 14A becomes smaller. In this regard, the bent portion 18 is bent such that the protrusion margin becomes larger as the gap to the one end 14A becomes smaller, thereby the redundant portion can be appropriately enclosed. Accordingly, stress which could be generated in the flexible board 14 can be suitably alleviated.

Moreover, the bent portion 18 is bent such that the protrusion base end portions 18A and the protrusion tip end portion 18B are curved together along the curving direction and that the curvature of the protrusion tip end portion 18B becomes smaller than that of the protrusion base end portions 18A. With this configuration, the redundant portion, which is created by the one end 14A of the flexible board 14 being curved by following the mounting surface 11MS, can be appropriately enclosed further by the bent portion 18 in which the protrusion base end portions 18A and the protrusion tip end portion 18B are curved together along the curving direction. Additionally, the bent portion 18 is bent such that the curvature of the protrusion tip end portion 18B becomes smaller than that of the protrusion base end portions 18A; therefore, it is suitable for equalizing between the protrusion base end portions 18A and the protrusion tip end portion 18B.

Further, in the bent portion 18, the curvature of the protrusion base end portions 18A is set equal to that of the mounting surface 11MS. With this configuration, the redundant portion, which is created by the one end 14A of the flexible board 14 being curved by following the mounting surface 11MS, can be mostly enclosed by the bent portion 18. Accordingly, stress due to the redundant portion is hardly created at the portion on the side of the other end 14B among the flexible board 14 with respect to the bent portion 18; therefore, stress that could be generated in the flexible board 14 can be more suitably alleviated.

Furthermore, the bent portion 18 is provided over the entire length along the curving direction. With this configuration, as compared to the case of the bent portion being assumed to be provided only partially along the curving direction, the bent portion 18 can be formed easier.

Still further, the bent portion 18 is bent so as to protrude inward in the flexible board 14 being folded back. With this configuration, as compared to the case of the bent portion 18 being assumed to be protruded outward in the flexible board 14, the bent portion 18 is well fitted and does not easily interfere with components arranged on the outside.

Still further, the bend facilitating portions 19 are provided at positions that form the protrusion base end portions 18A and the protrusion tip end portion 18B in the bent portion 18. With this configuration, the bent portion 18 can be easily formed.

Moreover, the liquid crystal display device (display device) 10 according to the present embodiment includes, as mentioned above, the flexible board 14 and the liquid crystal panel 11 as the curved component, and the curved component is the liquid crystal panel (curved display panel) 11 that is configured to display an image. According to the liquid crystal display device 10 having the above configuration, because defects such as disconnection is not likely to occur in the flexible board 14 and malfunction that causes display failure does not occur easily, high operational reliability can be attained.

Second Embodiment

A second embodiment of the present invention will be described with reference to FIG. 8. The second embodiment shows a flexible board 114 in which a configuration of wiring 116 is changed. Note that overlapping descriptions of configurations, actions, and effects that are similar to those of the first embodiment described above are omitted.

Figure 8:
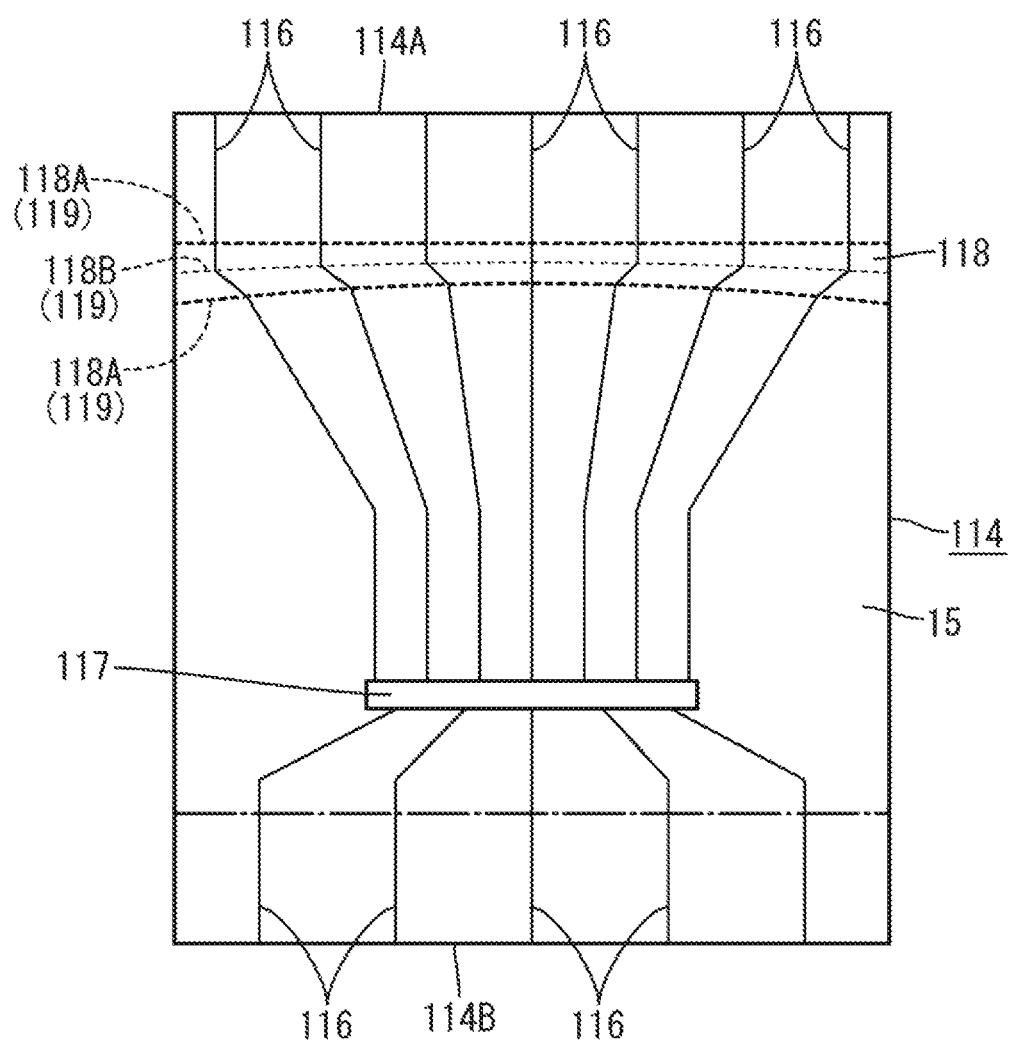
FIG. 8 is a plan view of a flexible board in a developed state according to a second embodiment of the present invention.

The wiring 116 according to the present embodiment is, as shown in FIG. 8, crosses bend facilitating portions 119 of a bent portion 118 in a course of extending from a one end 114A to another end 114B in a flexible board 114. Also, the wiring 116 has a configuration in which, at each of positions where a wire of the wiring 116 overlaps among the bend facilitating portions 119, with the bend facilitating portion 119 arranged at a protrusion base end portion 118A on a side of a driver 117 and with the bend facilitating portion 119 arranged at the protrusion tip end portion 118B, respectively, an extending angle of the wire changes. Specifically, each of the wires of the wiring 116 is routed substantially linearly along the Y-axis direction from the one end 114A until reaching the bend facilitating portion 119 arranged at the protrusion tip end portion 118B; however, each of the wires changes in the extending angle at a position overlapping with the bend facilitating portion 119 arranged at the protrusion tip end portion 118B and extends along an inclined direction with respect to both of the X-axis and Y axis directions. The wiring 116 further changes in the extending angle at a position overlapping with the bend facilitating portion 119 arranged at the protrusion base end portion 118A on the side of the driver 117. Note that among multiple wires of the wiring 116, the wire of the wiring 116 arranged at a center position along the X-axis direction exceptionally extends substantially linearly along the Y-axis direction. With this configuration, force is easily concentrated at the bend facilitating portions 119 in forming the bent portion 118; therefore, an effect of more easily forming the bent portion 118 can be attained.

According to the present embodiment as described above, the wiring 116 that extends from the one end 114A to the other end 114B is at least provided, and in the wiring 116, the extending angle of each of the wires changes at the bend facilitating portions 119 in the bent portion 118. With this configuration, the wiring 116 crosses the bend facilitating portions 119 in the bent portion 118 in a course of extending from the one end 114A to the other end 114B. By configuring the extending angle of the wiring 116 to change in the bend facilitating portions 119, force is easily concentrated at the bend facilitating portions 119 in forming the bent portion 118. Accordingly, the bent portion 118 can be formed easier.

Third Embodiment

A third embodiment of the present invention will be described with reference to FIG. 9. The third embodiment shows a flexible board 214 whose configuration is changed from that of the first embodiment described above. Note that overlapping descriptions of configurations, actions, and effects that are similar to those of the first embodiment described above are omitted.

Figure 9:
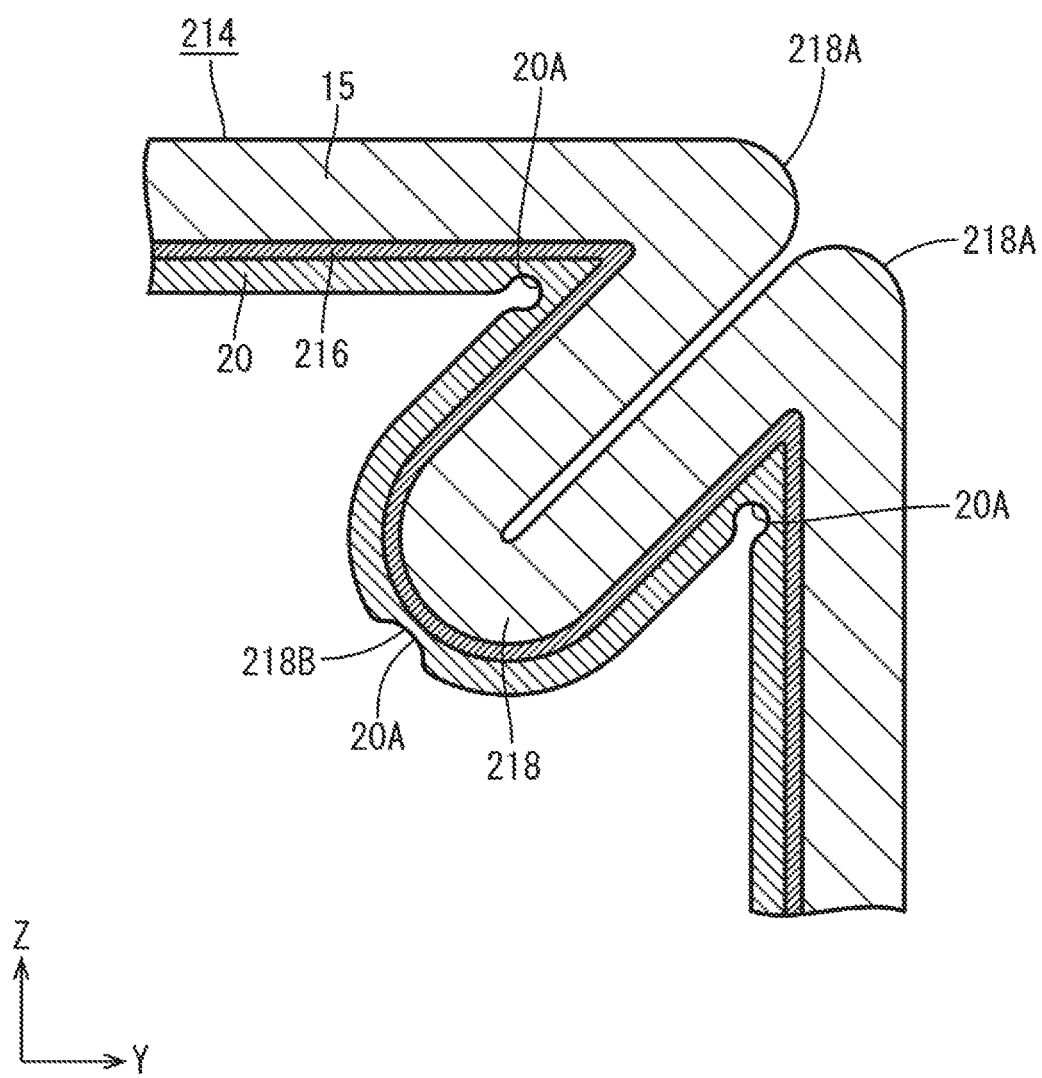
FIG. 9 is a cross-sectional view of a flexible board according to a third embodiment of the present invention.

As shown in FIG. 9, the flexible board 214 of the present embodiment includes an insulation film 20 that covers the majority of wiring 216 extending from a one end to another end. The insulation film 20 is formed such that a film thickness is locally thinned. Specifically, in the insulation film 20, at each of bend facilitating portions 219 arranged in each of protrusion base end portions 218A and a protrusion tip end portion 218B in a bent portion 218, the film thickness is formed thinner than that of other portions and formed as a recessed portion 20A. With this configuration, force is easily concentrated at the bend facilitating portions 219 in forming the bent portion 218; therefore, an effect of more easily forming the bent portion 218 can be attained.

According to the present embodiment as described above, the wiring 216 that extends from the one end to the other end and the insulation film 20 that covers the wiring 216 are at least provided, and in the insulation film 20, the film thickness at the bend facilitating portions 219 in the bent portion 218 is formed thinner than that of other portions. With this configuration, the wiring 216 crosses the bend facilitating portions 219 in the bent portion 218 in a course of extending from the one end to the other end. By configuring, in the bend facilitating portions 219, the film thickness of the insulation film 20 that covers the wiring 216 thinner than that of other portions, force is easily concentrated at the bend facilitating portions 219 in forming the bent portion 218. Accordingly, the bent portion 218 can be formed easier.

Fourth Embodiment

A fourth embodiment of the present invention will be described with reference to FIGS. 10 to 12. The fourth embodiment shows a control circuit board 313 whose configuration is changed from that of the first embodiment described above. Note that overlapping descriptions of configurations, actions, and effects that are similar to those of the first embodiment described above are omitted.

Figure 10:
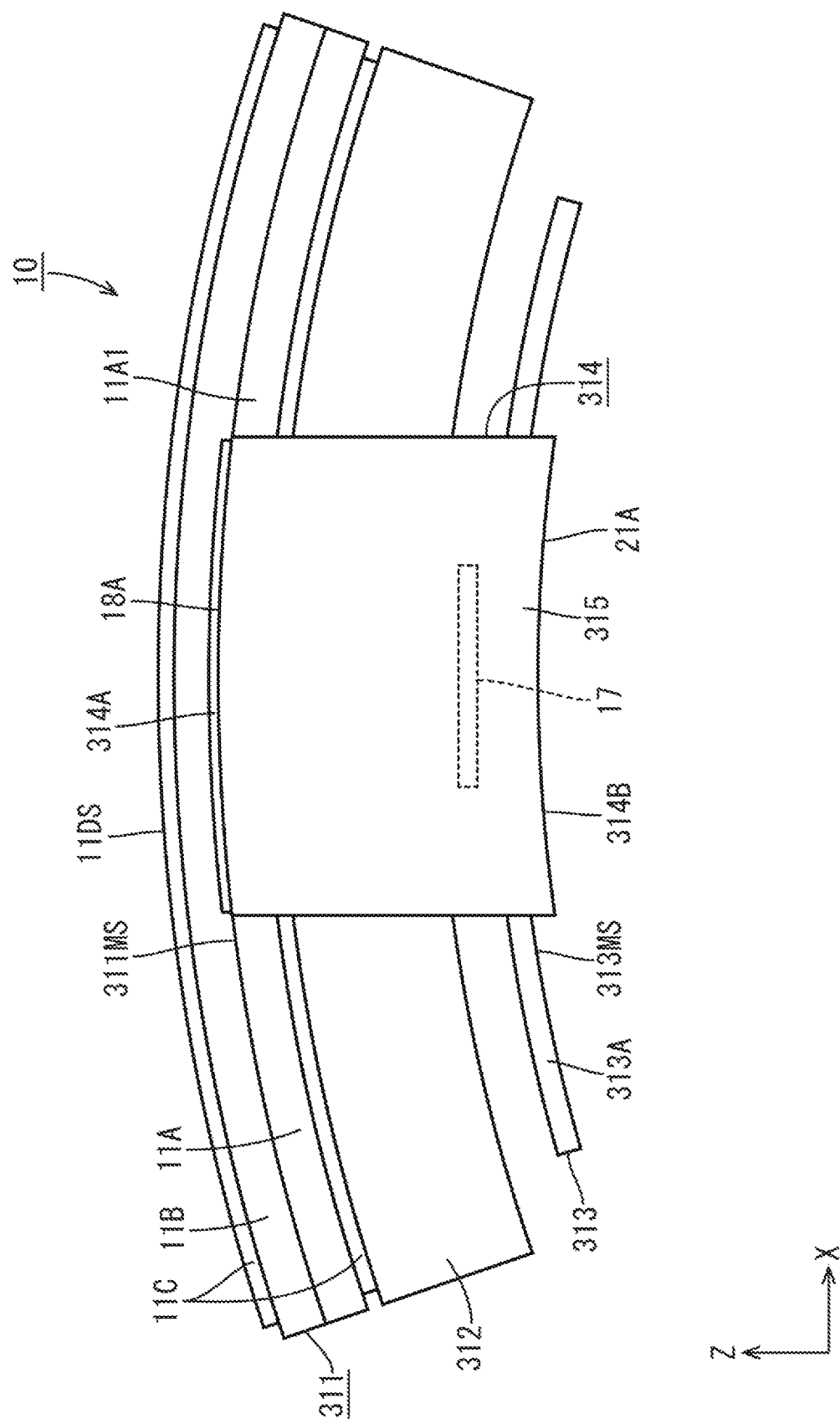
FIG. 10 is a front view of a liquid crystal display device according to a fourth embodiment of the present invention.

As shown in FIG. 10, the control circuit board (second curved component) 313 of the present embodiment has a shape that is curved in parallel with a liquid crystal panel 311 and a backlight device 312. Specifically, the control circuit board 313 is curved in a substantially circular arc shape in which a center portion in the X-axis direction is projected toward the front side and both end portions in the long-side direction are recessed toward the rear side, and a curving direction of the control circuit board 313 coincides with the X-axis direction. A board surface on the rear side at an end portion 313A of the control circuit board 313 is formed as a mounting surface (second mounting surface) 313MS on which another end 314B of a flexible board 314 is mounted. The other end 314B of the flexible board 314 thus mounted curves by following the mounting surface 313MS. Accordingly, the flexible board 314 has a gap between an intermediate portion and the other end 314B which changes according to a position along the X-axis direction (curving direction). Specifically, the above gap is the largest at both end positions and the smallest at a center position along the X-axis direction of the flexible board 314. Accordingly, the center portion at which the gap is small creates a larger amount of redundant portion than the both end portions at which the gap is large.

Figure 11:
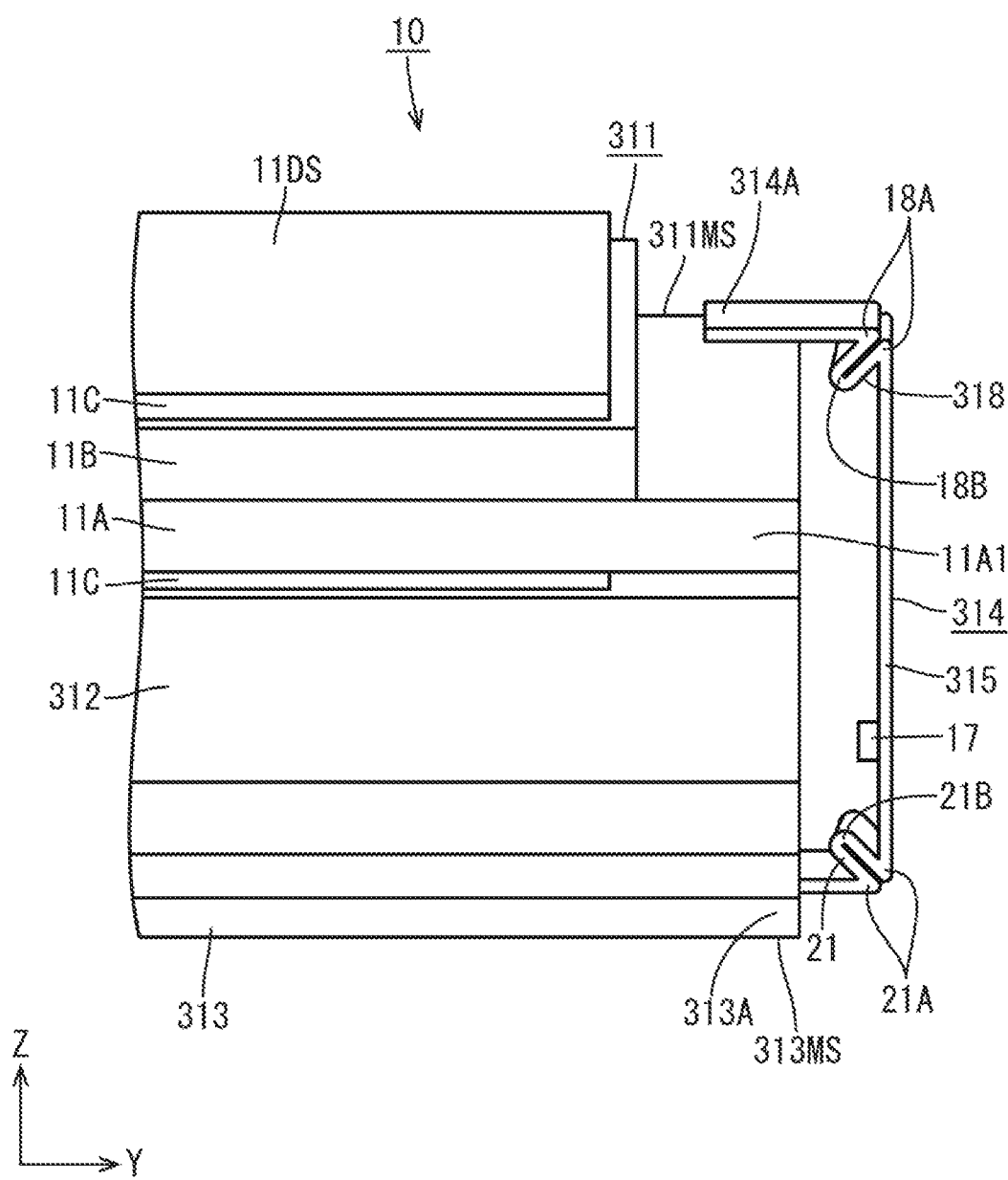
FIG. 11 is a side view of the liquid crystal display device.

To overcome this problem, as shown in FIG. 11, the flexible board 314 according to the present embodiment includes, at a position between a bent portion 318 and the other end 314B, a second bent portion 21 formed by bending the flexible board 314 so as to protrude in a direction that crosses a board surface of the flexible board 314. Specifically, the second bent portion 21 is arranged between a driver 317 and the other end 314B, and similarly to the bent portion 318, is formed by protruding a portion of the intermediate portion of the flexible board 314 inward along the Y-axis direction. Also, the second bent portion 21 is provided, among the above intermediate portion, at least at the center portion along the X-axis direction, that is, at a portion where the gap to the other end 314B becomes small. With this configuration, in the above intermediate portion in the flexible board 314, the redundant portion created by change in the gap to the other end 314B can be enclosed by the second bent portion 21. Accordingly, stress which could be generated in the flexible board 314 can be alleviated, thereby suppressing defects such as disconnection from occurring.

Figure 12:
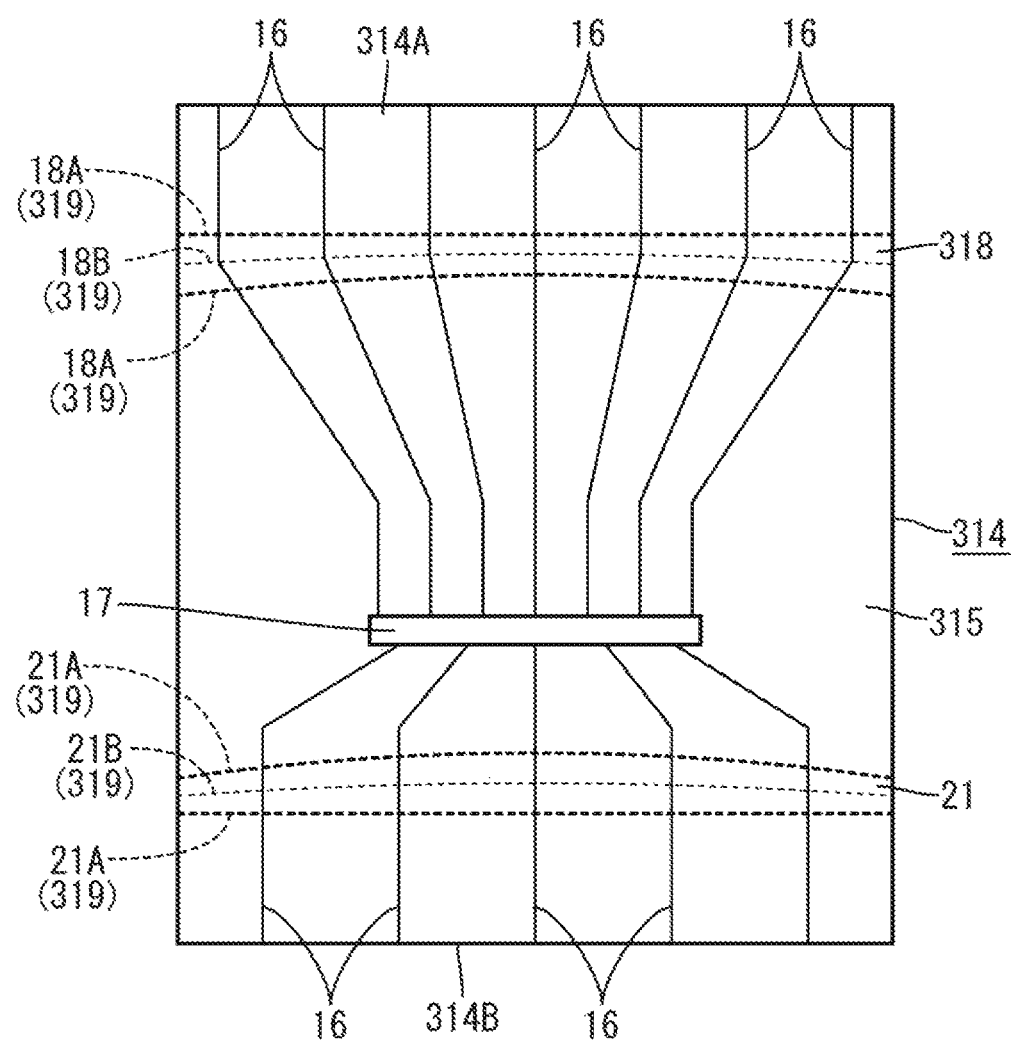
FIG. 12 is a plan view of a flexible board in a developed state.

More specifically, as shown in FIG. 12, the second bent portion 21 is provided over the entire width of the flexible board 314 along the X-axis direction, similarly to the bent portion 318. Further, similarly to the bent portion 318, bend facilitating portions 319 are provided at a pair of protrusion base end portions 21A and a protrusion tip end portion 21B being bent positions in the second bent portion 21. The bend facilitating portions 319 arranged in the pair of protrusion base end portions 21A are formed on an outer board surface of the base member 315 of the flexible board 314, and the bend facilitating portion 319 arranged in the protrusion tip end portion 21B is formed on an inside board surface of the base member 315. Further, as shown in FIG. 10, the second bent portion 21 is formed into a curved shape in which the protrusion base end portion 21A on a side of the other end 314B is in parallel with the mounting surface 313MS similarly to the other end 314B, and meanwhile, the protrusion base end portion 21A on a side of the driver 317 (side of the bent portion 318 and a one end 314A) is also in parallel with the protrusion base end portion 21A on the side of the other end 314B. Then, the second bent portion 21 is configured such that the protrusion tip end portion 21B has a curved shape and is bent with a curvature smaller than that of the pair of protrusion base end portions 21A.

In order to facilitate forming of the second bent portion 21 having the above configuration, first, the bend facilitating portion 319 arranged in the protrusion base end portion 21A on the side of the other end 314B has a linear shape running along the X-axis direction in parallel with the other end 314B, as shown in FIG. 12. The bend facilitating portion 319 arranged in the protrusion base end portion 21A on the side of the driver 317 has a circular arc shape in plan view, a curve of which gradually approaches the protrusion base end portion 21A on the side of the other end 314B from the center position toward the both end positions along the X-axis direction. The bend facilitating portion 319 arranged in the protrusion tip end portion 21B has a circular arc shape similar to that of the bend facilitating portion 319 arranged in the protrusion base end portion 21A on the side of the driver 317; however, a curvature of which is set relatively small. More specifically, the bend facilitating portion 319 arranged in the protrusion tip end portion 21B is located at an approximately intermediate position between the bend facilitating portion 319 arranged in the protrusion base end portion 21A on the side of the other end 314B and the bend facilitating portion 319 arranged in the protrusion base end portion 21A on the side of the driver 317. A distance from each of the bend facilitating portions 319 arranged in each of the protrusion base end portions 21A to the bend facilitating portion 319 arranged in the protrusion tip end portion 21B is the largest at the center position along the X-axis direction and the smallest at the both end positions along the X-axis direction. Accordingly, the second bent portion 21 bent and formed based on the above bend facilitating portions 319 has a protrusion margin from each of the protrusion base end portions 21A to the protrusion tip end portion 21B which is the largest at the center position along the X-axis direction and the smallest at the both end positions along the X-axis direction. In other words, it can be said that the second bent portion 21 is curved such that the protrusion margin becomes larger as the gap to the other end 314B becomes smaller.

As described above, according to the present embodiment, the other end 314B is mounted, in the control circuit board (second curved component) 313 arranged to overlap the liquid crystal panel 311, on the mounting surface (second mounting surface) 313MS with a curved shape in parallel with a mounting surface 311MS. The second bent portion 21 is provided in which, at a position between the bent portion 318 and the other end 314B, the gap to the other end 314B changes according to the position along the curving direction, the second bent portion 21 being formed by bending at least a portion among the positions where the gap to the other end 314B is small so as to make the portion protrude in a direction that crosses the board surface of the flexible board 314. With this configuration, in the control circuit board 313, the mounting surface 313MS on which the other end 314B of the flexible board 314 is mounted is curved in parallel with the mounting surface 311MS of the liquid crystal panel 311; therefore, a space required for installing the liquid crystal panel 311 and the control circuit board 313 can be made compact. The flexible board 314 connected to the liquid crystal panel 311 and the control circuit board 313 includes the second bent portion 21 at a position between the bent portion 318 and the other end 314B, and because this second bent portion 21 is formed by bending at least a portion where the gap to the other end 314B is small so as to make the portion protrude in the direction that crosses the board surface of the flexible board 314, the redundant portion created by change in the gap to the other end 314B can be enclosed by the second bent portion 21. Accordingly, stress which could be generated in the flexible board 314 can be alleviated, thereby suppressing defects such as disconnection from occurring.

Fifth Embodiment

A fifth embodiment of the present invention will be described with reference to FIG. 13 or 14. The fifth embodiment shows a liquid crystal panel 411 and a backlight device 412 whose configurations are changed from that of the first embodiment described above. Note that overlapping descriptions of configurations, actions, and effects that are similar to those of the first embodiment described above are omitted.

Figure 13:
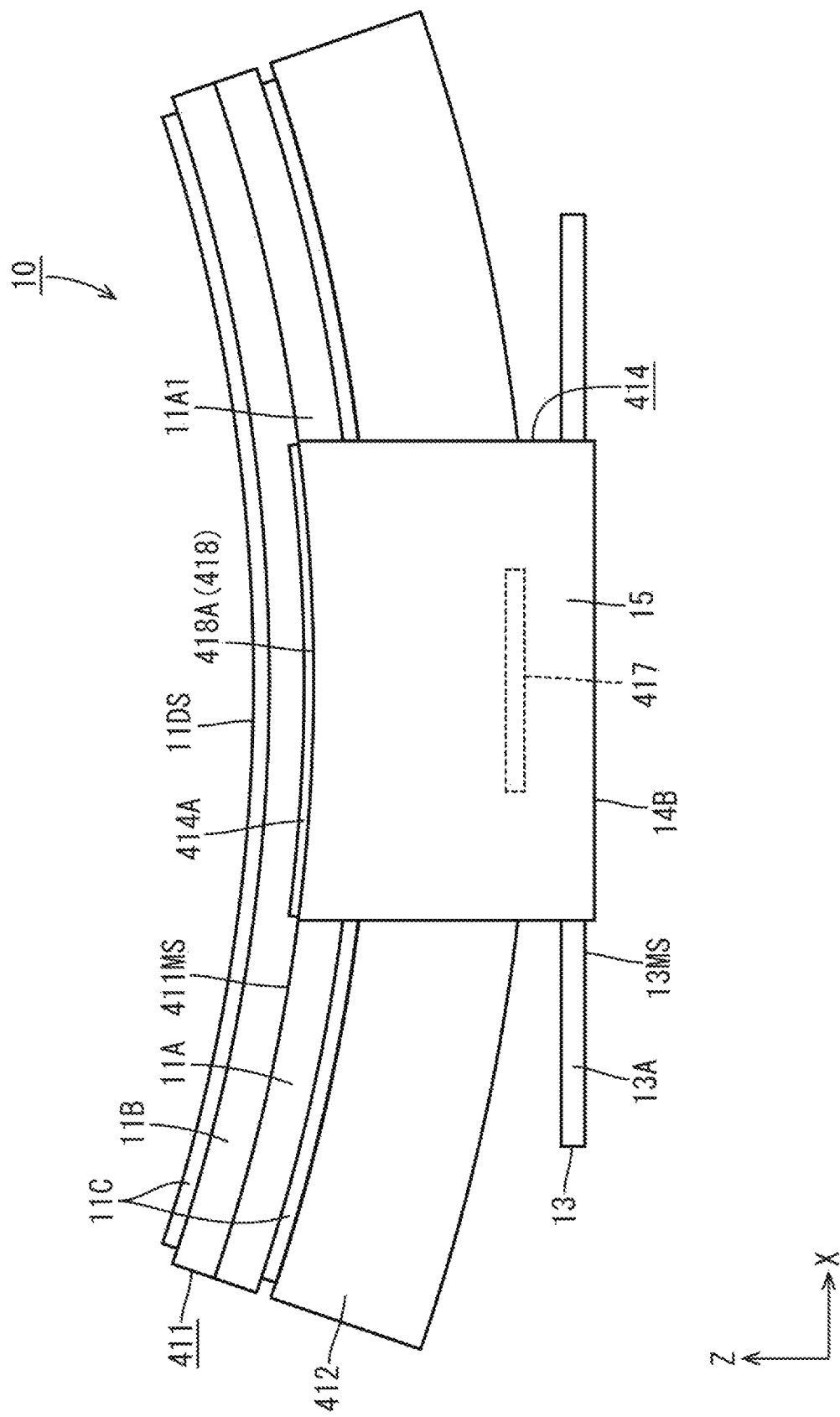
FIG. 13 is a front view of a liquid crystal display device according to a fifth embodiment of the present invention.

As shown in FIG. 13, the liquid crystal panel 411 and the backlight device 412 according to the present embodiment are curved in a substantially circular arc shape in which a center portion along the X-axis direction is recessed toward the rear side and both end portions along the X-axis direction are projected toward the front side (inwardly-warped shape or reverse camber shape). The liquid crystal panel 411 and the backlight device 412 are curved about a not-shown curving axis that extends along the Y-axis direction and arranged on the front side to the liquid crystal panel 411. A curving direction of the liquid crystal panel 411 and the backlight device 412 coincides with the X-axis direction similarly to the first embodiment described above. A one end 414A of a flexible board 414 mounted on a mounting surface 411MS of the liquid crystal panel 411 curves by following the mounting surface 411MS. Accordingly, the flexible board 414 has a gap between an intermediate portion and the one end 414A which changes according to a position along the X-axis direction (curving direction). Specifically, the above gap is the largest at both end positions and the smallest at a center position along the X-axis direction of the flexible board 414. Accordingly, the center portion at which the gap is small creates a larger amount of redundant portion than the both end portions at which the gap is large.

Figure 14:
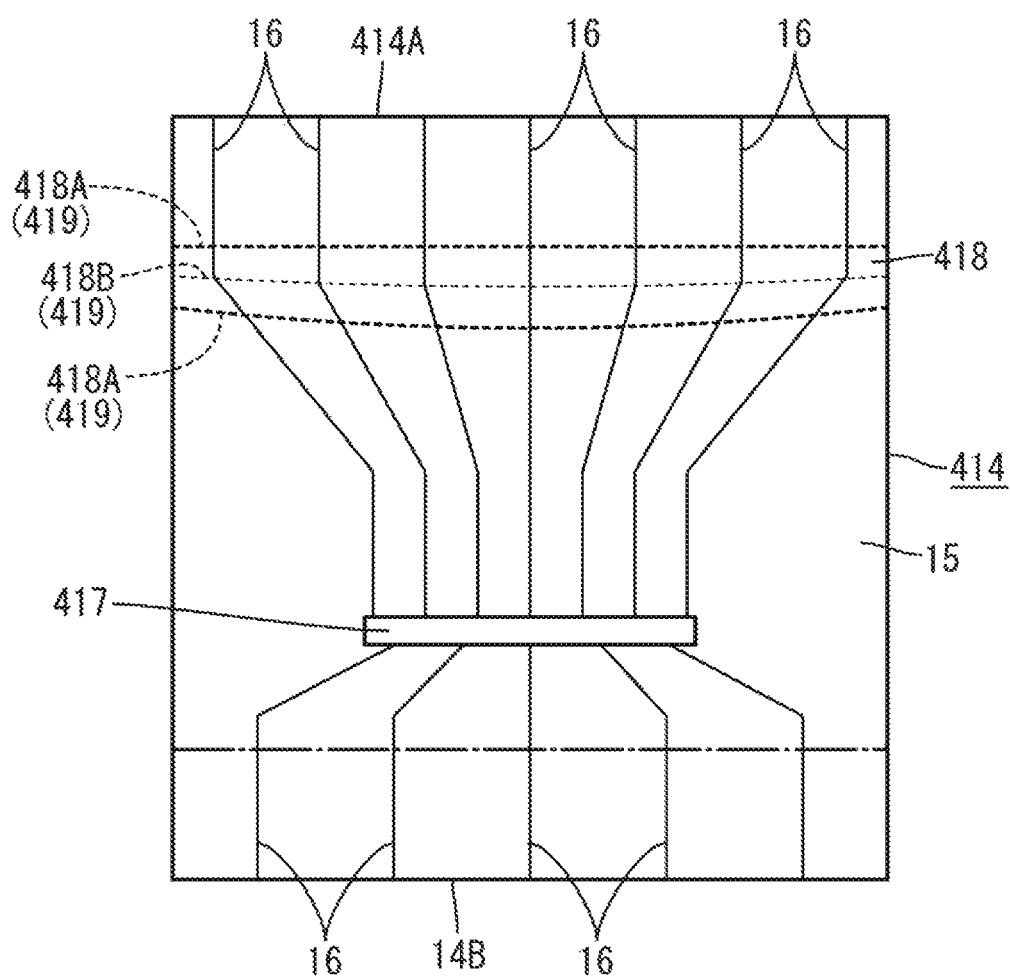
FIG. 14 is a plan view of a flexible board in a developed state.

On the other hand, a bent portion 418 according to the present embodiment is configured such that, as shown in FIG. 14, a protrusion margin along the X-axis direction becomes larger at a center side than both end sides. That is, the bent portion 418 has a substantially similar configuration as the second bent portion 21 (FIG. 12) described in the fourth embodiment above. In other words, in the bent portion 418, a bend facilitating portion 419 arranged in a protrusion base end portion 418A on a side of a driver 417 has a circular arc shape in plan view, a curve of which gradually approaches a protrusion base end portion 418A on a side of the one end 414A from the center position toward the both end positions along the X-axis direction. The bend facilitating portion 419 arranged in a protrusion tip end portion 418B has a circular arc shape similar to that of the bend facilitating portion 419 arranged in the protrusion base end portion 418A on the side of the driver 417; however, a curvature of which is set relatively small. Further, in the bent portion 418, the bend facilitating portion 419 arranged in the protrusion base end portion 418A on a side of the one end 414A has a linear shape running along the X-axis direction in parallel with the one end 414A.

Sixth Embodiment

A sixth embodiment of the present invention will be described with reference to FIG. 15. The sixth embodiment shows a bent portion 518 whose configuration is changed from that of the first embodiment described above. Note that overlapping descriptions of configurations, actions, and effects that are similar to those of the first embodiment described above are omitted.

Figure 15:
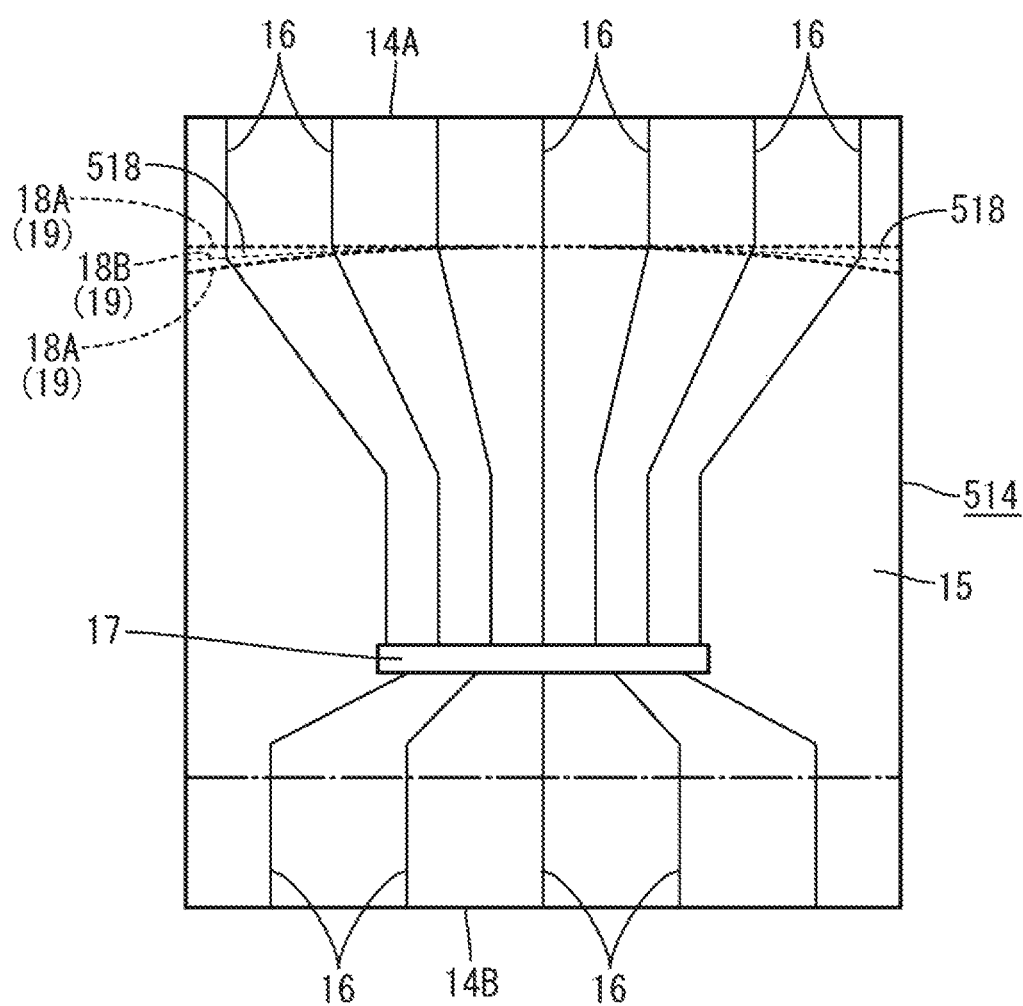
FIG. 15 is a plan view of a flexible board in a developed state according to a sixth embodiment of the present invention.

The bent portion 518 according to the present embodiment is, as shown in FIG. 15, provided partially along the X-axis direction at an intermediate portion of a flexible board 514. In other words, the bent portion 518 are provided selectively in both end portions along the X-axis direction at the intermediate portion of the flexible board 514, and is not formed at a center portion along the X-axis direction.

Other Embodiments

The present invention is not limited to the embodiments described in the above descriptions and drawings, and for example, the following embodiments are included in the technical scope of the present invention.

(1) Each of the above embodiments describes a case of the bent portion protruding inward in the flexible board with the bent portion being folded back; however, a configuration may be adopted in which the bent portion protrudes outward in the flexible board with the bent portion being folded back. This also applies to the second bent portion described in the fourth embodiment, which means that the second bent portion may have a configuration of protruding outward.

(2) Each of the above embodiments describes a case of performing curving processing on the liquid crystal panel and the backlight device after mounting the flexible board while assembling the liquid crystal panel and the backlight device in a flat state; however, a manufacturing procedure can be changed to other procedures. For example, the flexible board may be mounted at the one end thereof on the liquid crystal panel in a flat state, before performing curving processing on the liquid crystal panel, and thereafter, the backlight device which has been separately subjected to curving processing may be assembled to the liquid crystal panel.

(3) Each of the above embodiments describes case of setting the curvature of the protrusion base end portions in the bent portion equal to that of the mounting surface; however, the curvature of the protrusion base end portion in the bent portions may differ from that of the mounting surface. This also applies to the second bent portion described in the fourth embodiment, which means that the curvature of the protrusion base end portions in the second bent portion may differ from that of the mounting surface.

(4) Each of the above embodiments describes a case of forming the bend facilitating portions by partially recessing the base member of the flexible board; however, the bend facilitating portions may be formed by partially penetrating the base member. Also, the bend facilitating portion may take a configuration other than perforations (such as folds).

(5) Each of the above embodiments describes a case of forming the liquid crystal panel and the backlight device into a curved shape; however, the liquid crystal panel and the backlight device may be formed flat, and in contrast, the control circuit board may be formed into a curved shape.

(6) Each of the above embodiments describes a case in which, in the flexible board, a direction running from the one end to the other end is the long-side direction; however, a configuration may be adopted in which, in the flexible board, the direction running from the one end to the other end may be the short-side direction.

(7) Each of the above embodiments describes a case in which the curving direction of the liquid crystal panel and the control circuit board is only one direction; however, the curving direction of the liquid crystal panel and the control circuit board may be two directions.

(8) Each of the above embodiments describes a case of forming each of the substrates of the liquid crystal panel from glass material; however, each of the substrates of the liquid crystal panel may be formed from material such as synthetic resin material.

(9) Each of the above embodiments describes a case of COF-mounting the driver on the flexible board; however, the driver may be chip on glass (COG)-mounted on the array substrate.

(10) Each of the above embodiments describes the liquid crystal display device including the liquid crystal panel having a rectangular shape in plan view; however, a liquid crystal display device including a liquid crystal panel having a shape in plan view of square, circle, oval or the like can be applied in the present invention.

(11) Each of the above embodiments exemplifies the liquid crystal panel having a configuration in which a liquid crystal layer is sandwiched between the pair of substrates; however, a liquid crystal panel in which the pair of substrates sandwich functional organic molecules other than liquid crystal material can be applied in the present invention.

(12) Each of the above embodiments uses the TFTs as the switching elements of the liquid crystal panel; however, each of the embodiments can be applied to a liquid crystal panel using other switching elements (such as thin film diodes or TFDs) other than the TFTs, and can also be applied to a liquid crystal panel performing monochrome display other than the liquid crystal panel performing color display.

(13) Each of the above embodiments exemplifies the liquid crystal display device of a transmission type having the backlight device as the external light source; however, the present invention can be applied to a reflection type liquid crystal display device that performs display utilizing light from the outside, and in this case, a backlight device can be omitted. Also, the present invention can be applied to a liquid crystal display device of a semi-transmission type liquid crystal display device.

(14) Each of the above embodiments exemplifies the liquid crystal panel as a display panel; however, the present invention can be applied to other types of display panel such as plasma display panel (PDP), organic EL panel, electrophoretic display (EPD, microcapsule electrophoretic display panel), micro electro mechanical systems (MEMS) display panel.

The invention claimed is:

1. A flexible wiring board connecting a first component including a curved surface to a second component opposed to the first component and including a flat surface, the flexible wiring board comprising:
a first end curved along the curved surface of the first component and mounted on the curved surface;
a second end mounted on the flat surface of the second component; and
a middle portion extending from the first end to the second end, the middle portion including:
a flat section about perpendicular to the flat surface of the second component; and
a folded section folded to project from a back surface of the flat section at a boundary between the middle portion and the first end adjacent to an edge of the curved surface of the first component, the folded section including a first base curved along the first end and connected with the first end, a second base connected with the flat portion, and a distal end between the first base and second end and farther from the back surface of the flat section than the first base and the second base.

2. The flexible wiring board according to claim 1, wherein the first end is curved such that a vertex of the first end is farther from the second end in comparison to side edges of the first end, and
the folded section has a height that increases as a distance between the first base of the folded section and the second end measuring along a side edge of the flat portion decreases.

3. The flexible wiring board according to claim 2, wherein the first base of the folded section is curved along the first end and has a curvature equal to a curvature of the first end, and
the distal end of the folded section has a curvature greater than a curvature of the first base.

4. The flexible wiring board according to claim 1, wherein the folded section is provided for an entire length of the boundary between the middle portion and the first end.

5. The flexible wiring board according to claim 1, wherein the first base, the second base, and the distal end include thickness reduced sections having thicknesses less than thicknesses of other sections of the first base, the second base, and the distal end to be folded.

6. The flexible wiring board according to claim 5, wherein the thickness reduced sections of each of the first base, the second base, and the distal end are arranged at equal intervals.

7. The flexible wiring board according claim 6, further comprising:
  at least one conductive line extending from the first end to the second end of the flexible wiring board; and
  an insulating film covering the at least one conductive line, wherein
  the insulating film includes thickness reduced sections having a thickness less than a thickness of other sections of the insulating film, and
  the thickness reduced sections of the insulating film are disposed in the thickness reduced sections of the first base, the second base, and the distal end of the folded section, respectively.

8. The flexible wiring board according to claim 1, further comprising at least one conductive line extending from the first end to the second end of the flexible wiring board, the at least one conductive line extending linearly from the first end to the distal end of the folded section and bends at the distal end so that a section of the at least one conductive line in the flat section is disposed farther from a side edge of the middle portion adjacent to a section of the at least one conductive line in the first end.

9. A flexible wiring board connecting a first component including a curved surface to a second component opposed to the first component and including a curved surface, the flexible wiring board comprising:
  a first end curved along the curved surface of the first component and mounted on the curved surface of the first component;
  a second end curved along the curved surface of the second component and mounted on the curved surface of the second component, the second end being about parallel to the first end; and
  a middle portion extending from the first end to the second end, the middle portion including:
    a flat section about perpendicular to vertexes of the first end and the second end;
    a first folded section folded to project from a back surface of the flat section at a boundary between the middle portion and the first end adjacent to an edge of the curved surface of the first component, the first folded section including a first base curved along the first end and connected with the first end, a second base connected with the flat portion, and a first distal end between the first base and second end and farther from the back surface of the flat section than the first base and the second base; and
    a second folded section folded to project from the back surface of the flat section at a boundary between the middle portion and the second end adjacent to an edge of the curved surface of the second component, the second folded section including a third base connected with the flat portion, a fourth base curved along the second end and connected with the second end, and a second distal end between the third base and the fourth base and farther from the back surface of the flat section than the third base and the fourth base.

10. A display device comprising:
  a first component including a curved surface;
  a second component including a flat surface; and
  a flexible wiring board according to claim 1.

11. A display device comprising:
  a first component including a curved surface;
  a second component including a curved surface; and
  a flexible wiring board according to claim 9.

* * * * *